(12) United States Patent
Huang et al.

(10) Patent No.: US 9,373,938 B2
(45) Date of Patent: Jun. 21, 2016

(54) PHOTONIC DEVICE STRUCTURE AND FABRICATION METHOD THEREOF

(71) Applicant: SiFotonics Technologies Co., Ltd., Woburn, MA (US)

(72) Inventors: Mengyuan Huang, Beijing (CN); Pengfei Cai, Beijing (CN); Liangbo Wang, Beijing (CN); Su Li, Beijing (CN); Wang Chen, Beijing (CN); Ching-yin Hong, Lexington, MA (US); Dong Pan, Andover, MA (US)

(73) Assignee: SIFOTONICS TECHNOLOGIES CO., LTD., Woburn, MA (US)

( * ) Notice: Subject to any disclaimer, the term of this patent is extended or adjusted under 35 U.S.C. 154(b) by 0 days.

(21) Appl. No.: 14/705,188

(22) Filed: May 6, 2015

(65) Prior Publication Data

US 2015/0236478 A1     Aug. 20, 2015

Related U.S. Application Data

(63) Continuation-in-part of application No. 14/079,318, filed on Nov. 13, 2013, now Pat. No. 9,042,417.

(60) Provisional application No. 61/796,465, filed on Nov. 13, 2012.

(51) Int. Cl.
| | |
|---|---|
| *H01S 5/00* | (2006.01) |
| *H01S 5/20* | (2006.01) |
| *H01S 5/02* | (2006.01) |
| *H01S 5/30* | (2006.01) |
| *H01L 31/0352* | (2006.01) |
| *H01L 31/105* | (2006.01) |
| *H01S 5/183* | (2006.01) |
| *H01S 5/22* | (2006.01) |

(52) U.S. Cl.
CPC ...... *H01S 5/2054* (2013.01); *H01L 31/035254* (2013.01); *H01L 31/105* (2013.01); *H01S 5/021* (2013.01); *H01S 5/2004* (2013.01); *H01S 5/3013* (2013.01); *H01S 5/3027* (2013.01); *H01S 5/3031* (2013.01); *H01S 5/18325* (2013.01); *H01S 5/18341* (2013.01); *H01S 5/20* (2013.01); *H01S 5/2018* (2013.01); *H01S 5/2059* (2013.01); *H01S 5/2205* (2013.01)

(58) Field of Classification Search
CPC ... H01S 5/2004; H01S 5/2018; H01S 5/2205; H01S 5/2059; H01S 5/20; H01S 5/3031; H01S 5/2054; H01S 5/021; H01S 5/3013; H01S 5/3027
USPC .............................. 372/45.01, 46.01, 46.015
See application file for complete search history.

(56) References Cited

U.S. PATENT DOCUMENTS

| | | | | |
|---|---|---|---|---|
| 7,450,309 | B1* | 11/2008 | Ma | ...... G02B 6/12007 359/618 |
| 2008/0237771 | A1* | 10/2008 | Pilla | ...... H04N 5/33 257/458 |

*Primary Examiner* — Kinam Park
(74) *Attorney, Agent, or Firm* — Han IP Corporation; Andy M. Han (57) ABSTRACT

Various embodiments of a photonic device and fabrication method thereof are described herein. A device may include a substrate, a bottom contact layer, a current confinement layer, an intrinsic layer, an absorption layer, and a top contact layer. The bottom contact layer may be of a first polarity and may be disposed on the substrate. The current confinement layer may be disposed on the bottom contact layer. The intrinsic layer may be disposed on the current confinement layer. The absorption layer may be disposed on the intrinsic layer. The top contact layer may be of a second polarity and may be disposed on the absorption layer. The second polarity is opposite to the first polarity.

8 Claims, 10 Drawing Sheets

PHOTONIC DEVICE STRUCTURE AND FABRICATION METHOD THEREOF

CROSS-REFERENCE TO RELATED PATENT APPLICATIONS

The present disclosure is a continuation-in-part (CIP) application of U.S. patent application Ser. No. 14/079,318, filed on Nov. 13, 2013, which is the non-provisional application of, and claims the priority benefit of U.S. Patent Application No. 61/796,465, filed on Nov. 13, 2012 and entitled "Method for Confining Current Through GeSi Photonic Devices". The above-identified applications are herein incorporated by reference in their entirety.

TECHNICAL FIELD

The present disclosure relates to photonic devices and, more particularly, to confining current in photonic devices.

BACKGROUND

Figure 7:
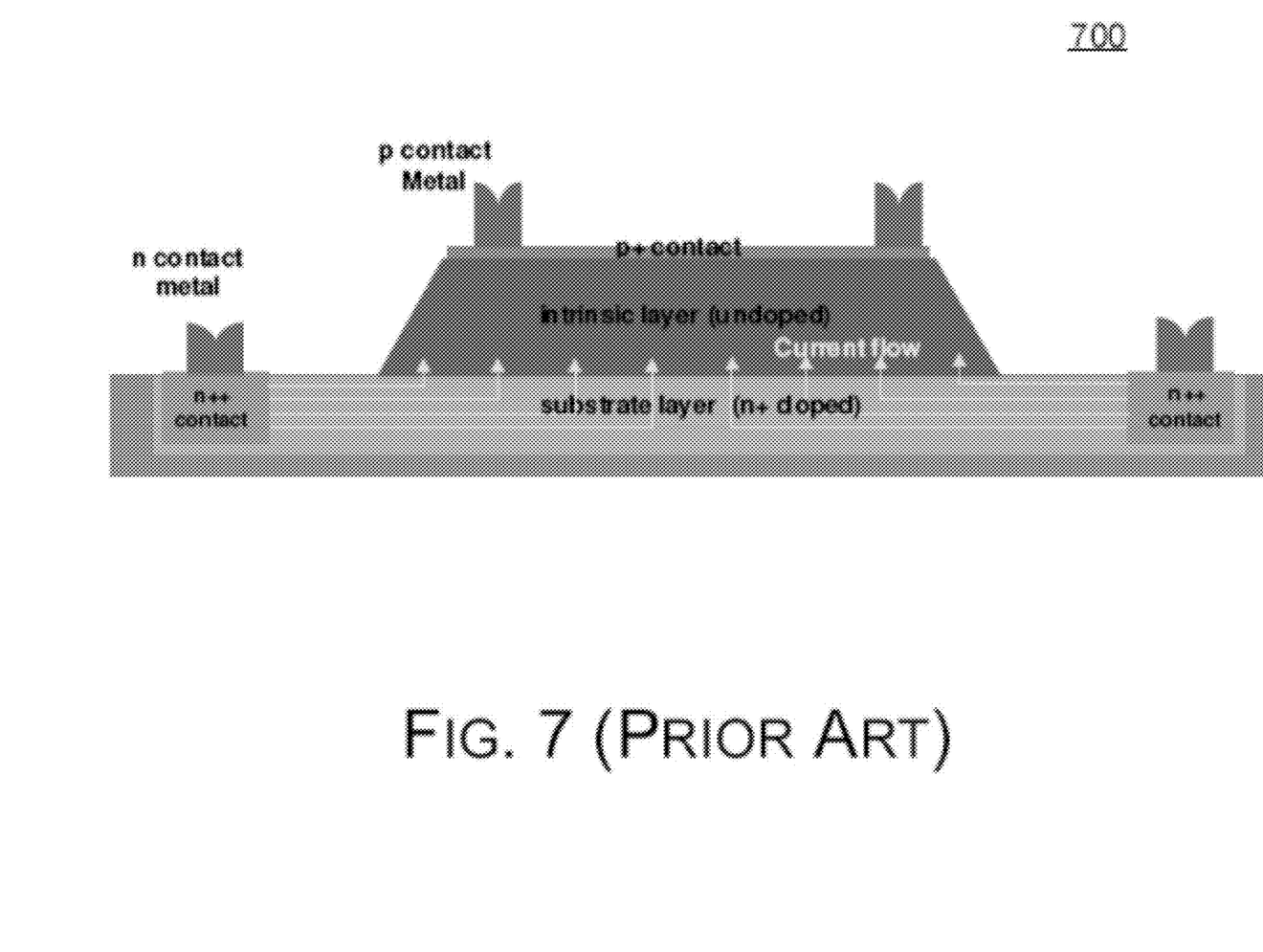
FIG. 7 is a structural diagram of a conventional photodiode device.

Typically the substrate layers in many conventional photonic devices are uniformly and heavily doped in order to reduce series resistance and/or to improve electrical connection, especially for high-speed optical communication applications. As a result, conductive currents can cross the entire interface between the photonic device and substrate, as illustrated in FIG. 7.

However, not all the conductive currents are useful for device operation, and current from certain region even causes negative impact on device performance of the photonic device. For example, for a photonic device the useful region is the central region under coupling aperture for normal incident light. Accordingly, those conductive currents crossing other regions are regarded as noise that hampers device performance. This condition tends to worsen especially when the photonic device has a large sidewall leakage current. Thus, there is a need to solve the aforementioned problems.

SUMMARY

In one aspect, a device may include: a substrate; a current confinement layer disposed on the substrate, the current confinement layer being doped in a pattern and configured to reduce dark current in the device; an absorption layer disposed on the current confinement layer; and an electrical contact layer disposed on the absorption layer and doped with dopants of a first polarity.

In one embodiment, a first portion of the current confinement layer may be doped with dopants of a second polarity opposite the first polarity, and a second portion of the current confinement layer surrounding the first portion may include an intrinsic region.

In one embodiment, the first portion of the current confinement layer may be doped with dopants of the second polarity with a doping concentration from about $1\times10^{16}$ to about $1\times10^{20}/cm^3$.

In one embodiment, the second portion of the current confinement layer may be doped with dopants of the second polarity with a doping concentration has a doping concentration less than $1\times10^{16}/cm^3$.

In one embodiment, a first primary side of the substrate may include a recess, and the current confinement may be disposed on the first primary side of the substrate in the recess. In one embodiment, an exposed surface of the electrical contact layer may be approximately flush with a portion of the first primary side of the substrate that is not recessed.

In one embodiment, the substrate may be made from a bulk Si wafer or a silicon-on-insulator (SOI) wafer.

In one embodiment, a region on a side of the substrate on which the current confinement layer is disposed may be doped with dopants of a second polarity opposite the first polarity to form a doped layer in the substrate.

In one embodiment, the current confinement layer may be made from material growth of Si, GeSi, Ge or a III-V material on the substrate.

In one embodiment, the absorption layer may be made from material growth of Si, GeSi, Ge or a III-V material on the current confinement layer.

In one embodiment, the device may be a normal incident photodiode or a waveguide photodiode.

In one embodiment, the device may be an edge-emitting laser or a vertical cavity surface emitting laser (VCSEL).

In another aspect, a method of fabrication of a device may include: forming a current confinement layer on a substrate, the current confinement layer being doped in a pattern and configured to reduce dark current in the device; forming an absorption layer on the current confinement layer; and forming an electrical contact layer on the absorption layer and doped with dopants of a first polarity.

In one embodiment, forming the current confinement layer on the substrate may include doping the current confinement layer such that a first portion of the current confinement layer with dopants of a second polarity opposite the first polarity.

In one embodiment, the first portion of the current confinement layer may be doped with dopants of the second polarity with a doping concentration from about $1\times10^{16}$ to about $1\times10^{20}/cm^3$.

In one embodiment, a second portion of the current confinement layer surrounding the first portion may be doped with dopants of the second polarity with a doping concentration has a doping concentration less than $1\times10^{16}/cm^3$.

In one embodiment, the method may further include etching a recess on a first primary side of the substrate, where forming the current confinement layer on the substrate may include forming the current confinement layer on the first primary side of the substrate in the recess.

In one embodiment, the substrate may be made from a bulk Si wafer or a SOI wafer.

In one embodiment, the method may further include doping a region on a side of the substrate on which the current confinement layer is disposed with dopants of a second polarity opposite the first polarity to form a doped layer in the substrate.

In one embodiment, the method may form the current confinement layer on the substrate by material growth of Si, GeSi, Ge or a III-V material on the substrate. In one embodiment, material growth may include an epitaxial process by RPCVD, UHV/CVD or MOCVD.

In one embodiment, the method may form the absorption layer on the current confinement layer by material growth of Si, GeSi, Ge or a III-V material on the current confinement layer. In one embodiment, material growth may include an epitaxial process by RPCVD, UHV/CVD or MOCVD.

In yet another aspect, a device may include: a substrate; a bottom contact layer of a first polarity disposed on the substrate; a current confinement layer disposed on the bottom contact layer; an intrinsic layer disposed on the current confinement layer; an absorption layer disposed on the intrinsic layer; and a top contact layer of a second polarity disposed on the absorption layer with the second polarity opposite to the first polarity.

In one embodiment, the current confinement layer may include a central region and an edge region surrounding the central region. The current confinement layer may be doped with first-type dopants of the first polarity, and a concentration of the first-type dopants in the central region may be higher than a concentration of the first-type dopants in the edge region.

In one embodiment, the intrinsic layer may have a thickness between 100 nm and 600 nm.

In one embodiment, the intrinsic layer may be depleted during a photodiode operation of the device.

In one embodiment, the device may also include a guard ring disposed in the intrinsic layer, the guard ring being on a side of the intrinsic layer that faces the absorption layer.

In one embodiment, the guard ring may be slightly doped with second-type dopants of the second polarity.

In one embodiment, the device may also include a compensated doping region disposed between the intrinsic layer and the absorption layer.

In one embodiment, the compensated doping region may be slightly doped with first-type dopants of the first polarity.

In one embodiment, the substrate may include a bulk silicon (Si) wafer or a silicon-on-insulator (SOI) wafer.

In one embodiment, the bottom contact layer may be made of Si and may be heavily doped with first-type dopants of the first polarity.

In one embodiment, the current confinement layer may be made of Si.

In one embodiment, the intrinsic layer may include an intrinsic Si layer.

In one embodiment, the absorption layer may include a germanium (Ge) absorption layer.

In one embodiment, the first polarity may be n and the second polarity may be p.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

In conventional photodiode devices, the conductive currents that cross the interface between the photonic device and substrate include at least the following: the current under the open area (optical sensitive area in photodiodes or photonic devices), the dark current under the blocked area without photonic illumination, and the leakage currents from sidewall. Not all of these currents have a positive contribution for photonic devices: for example, for photodiode, the region where the light is directly illuminated on (e.g., the central region) is useful for collecting optical signal and the rest parts are useless. The dark current generated in blocked area and the leakage current from sidewall do not have a positive contribution for photonic devices and, thus, need to be reduced or otherwise minimized significantly to improve the signal-to-noise ratio of devices, e.g., Ge/Si photonic devices such as photodiode, lasers and modulators. Accordingly, embodiments of a structure of the present disclosure include a current confinement layer that aids the reduction of dark current.

Illustrative Examples

Figure 1:
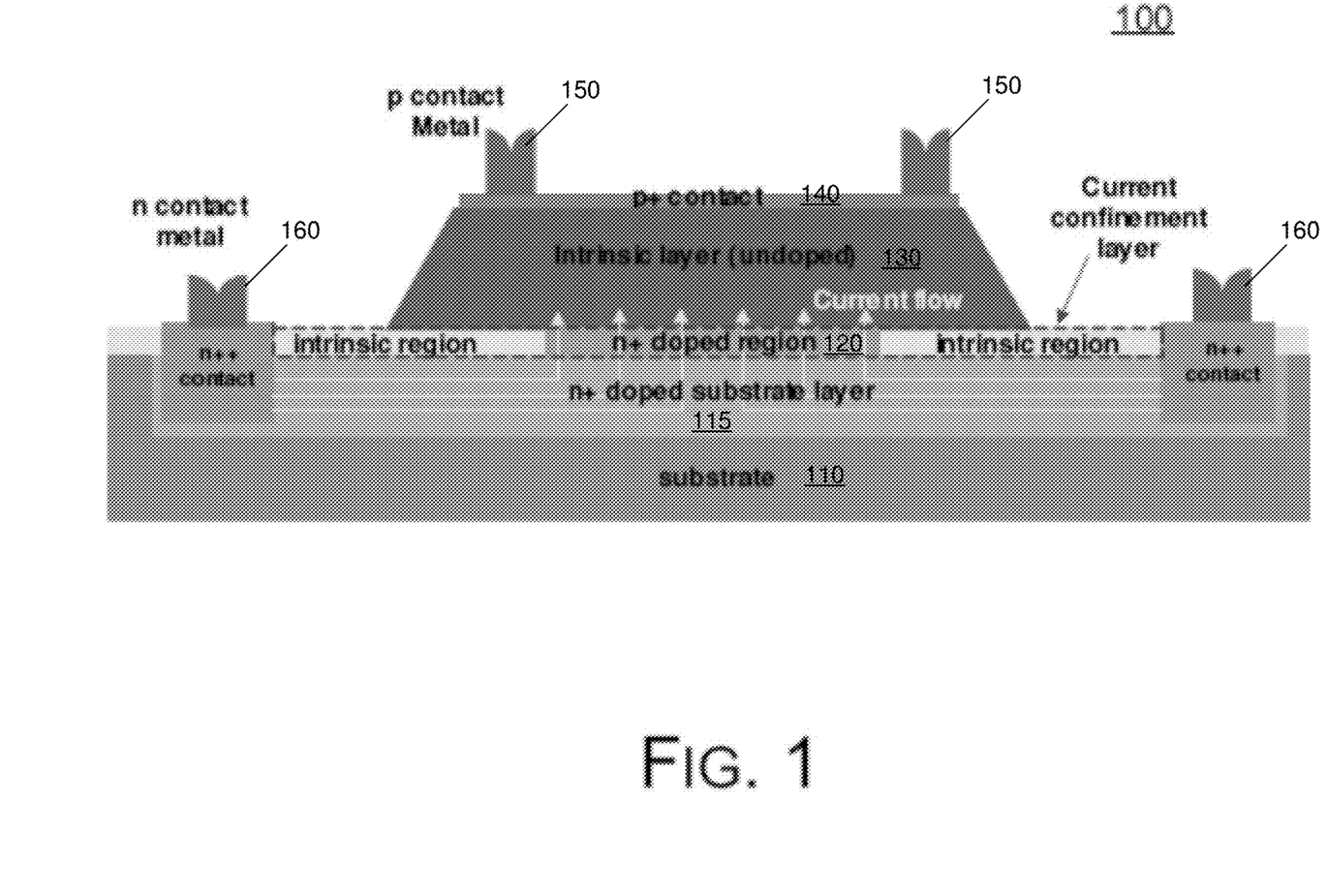
FIG. 1 is a structural diagram of a photodiode device with current confinement layer in accordance with an embodiment of the present disclosure.

FIG. 1 illustrates a photodiode device 100 with current confinement layer in accordance with an embodiment of the present disclosure.

As shown in FIG. 1, the photodiode device 100 includes a substrate 110, a current confinement layer 120 disposed on the substrate 110, an absorption layer 130, which may be an intrinsic layer, disposed on the current confinement layer 120, and an electrical contact layer 140 disposed on the absorption layer 130 for electrical connection. One or more electrical contacts 150 of a first polarity (e.g., p contacts), made of metal for example, may be disposed on the electrical contact layer 140, which is doped with dopants of the first polarity. The substrate 110 may be or made from, for example, a bulk silicon (Si) wafer or a silicon-on-insulator (SOI) wafer. The substrate 110 is heavily doped, and thus has a doped layer 115 doped with dopants of a second polarity opposite the first polarity (e.g., n+ doped substrate layer) near its top surface on which the current confinement layer 120 is disposed. One or more electrical contacts 160 of the second polarity (e.g., n++ contacts) may be located on the periphery of, and in contact with, the doped layer 115 and the current confinement layer 120.

The current confinement layer 120 may be formed by, for example, growth of Si, GeSi, Ge or other III-V material on the substrate 110. After growth, the current confinement layer 120 is doped in a pattern. For example, a select portion in the current confinement layer 120 (e.g., the central region thereof as shown in FIG. 1) is doped with higher concentration than other portions of the current confinement layer 120 (e.g., regions of the current confinement layer 120 surrounding the central region thereof). That is, the central region of the current confinement layer 120 may be doped while the regions surrounding the central region of the current confinement layer 120 may be intrinsic regions.

The absorption layer 130 is configured to collect optical signal, and may be formed by, for example, growth of Si, GeSi, Ge or other III-V material on the current confinement layer 120.

Different from conventional designs such as that shown in FIG. 7, the photodiode device 100 includes the current confinement layer 120 for reducing dark current. The current confinement layer 120 is not uniformly doped and has some pattern. As a result, most of the conductive currents will be confined to a region inside the heavily doped region of the current confinement layer 120 because of resistance differences.

In one embodiment, the material growth may include epitaxial processes done by reduced-pressure chemical vapor deposition (RPCVD), ultra-high vacuum chemical vapor deposition (UHV/CVD) or metal oxide chemical vapor deposition (MOCVD).

In one embodiment, the heavily doped region of the current confinement layer 120 may have a doping concentration from about $1 \times 10^{16}$ to about $1 \times 10^{20}$/cm$^3$. Moreover, the intrinsic regions of the current confinement layer 120 may have a doping concentration with a doping concentration less than $1 \times 10^{16}$/cm$^3$.

In one embodiment, the photodiode device 100 may be either a normal incident photodiode or a waveguide photodiode.

Figure 2:
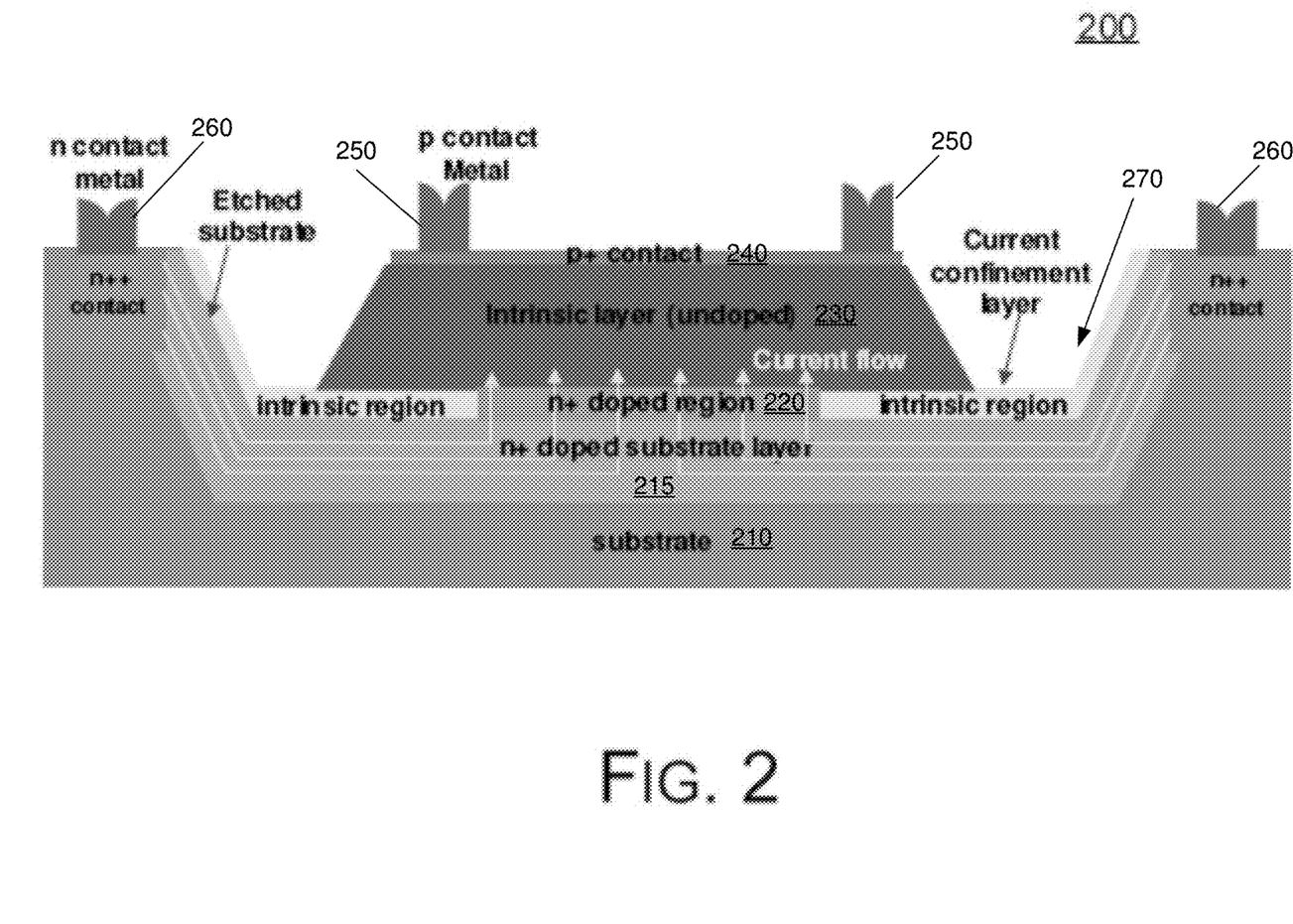
FIG. 2 is a structural diagram of a photodiode device with current confinement layer in accordance with another embodiment of the present disclosure.

FIG. 2 illustrates a photodiode device 200 with current confinement layer in accordance with another embodiment of the present disclosure.

As shown in FIG. 2, the photodiode device 200 includes a substrate 210, a current confinement layer 220 disposed on the substrate 210, an absorption layer 230, which may be an intrinsic layer, disposed on the current confinement layer 220, and an electrical contact layer 240 disposed on the absorption layer 230 for electrical connection. One or more electrical contacts 250 of the first polarity (e.g., p contacts), made of metal for example, may be disposed on the electrical contact layer 240, which is doped with dopants of the first polarity. The substrate 210 may be or made from, for example, a bulk Si wafer or a SOI wafer. The substrate 210 is etched first to form a recess 270 on the top side thereof, as shown in FIG. 2, and then heavily doped to form a doped layer 215 doped with dopants of the second polarity opposite the first polarity (e.g., n+ doped substrate layer) near its top surface on which the current confinement layer 220 is disposed. The recess 270 on the top side of the substrate 210 (i.e., the side of the substrate 210 on which the rest of the layers of the photodiode device 200 are disposed) allows the top surface, i.e., the electrical contact layer 240, to be substantially or at least approximately flush with peripheral regions of the substrate 210 that are not recessed, such as where one or more electrical contacts 260 of the second polarity (e.g., n++ contacts) are located. The one or more electrical contacts 260 may be in contact with the doped layer 215 of the substrate 210 but not in contact with the current confinement layer 220.

The current confinement layer 220 may be formed by, for example, growth of Si, GeSi, Ge or other III-V material on the substrate 210. After growth, the current confinement layer 220 is doped in a pattern. For example, a select portion in the current confinement layer 220 (e.g., the central region thereof as shown in FIG. 2) is doped with higher concentration than other portions of the current confinement layer 220 (e.g., regions of the current confinement layer 220 surrounding the central region thereof). That is, the central region of the current confinement layer 220 may be doped while the regions surrounding the central region of the current confinement layer 220 may be intrinsic regions.

The absorption layer 230 is configured to collect optical signal, and may be formed by, for example, growth of Si, GeSi, Ge or other III-V material on the current confinement layer 220.

Different from conventional designs such as that shown in FIG. 7, the photodiode device 200 includes the current confinement layer 220 for reducing dark current. The current confinement layer 220 is not uniformly doped and has some pattern. As a result, most of the conductive currents will be confined to a region inside the heavily doped region of the current confinement layer 220 because of resistance differences.

In one embodiment, the material growth may include epitaxial processes done by RPCVD, UHV/CVD or MOCVD.

In one embodiment, the heavily doped region of the current confinement layer 220 may have a doping concentration from about $1 \times 10^{16}$ to about $1 \times 10^{20}$/cm$^3$. Moreover, the intrinsic regions of the current confinement layer 220 may have a doping concentration with a doping concentration less than $1 \times 10^{16}$/cm$^3$.

In one embodiment, the photodiode device 200 may be either a normal incident photodiode or a waveguide photodiode.

Figure 3:
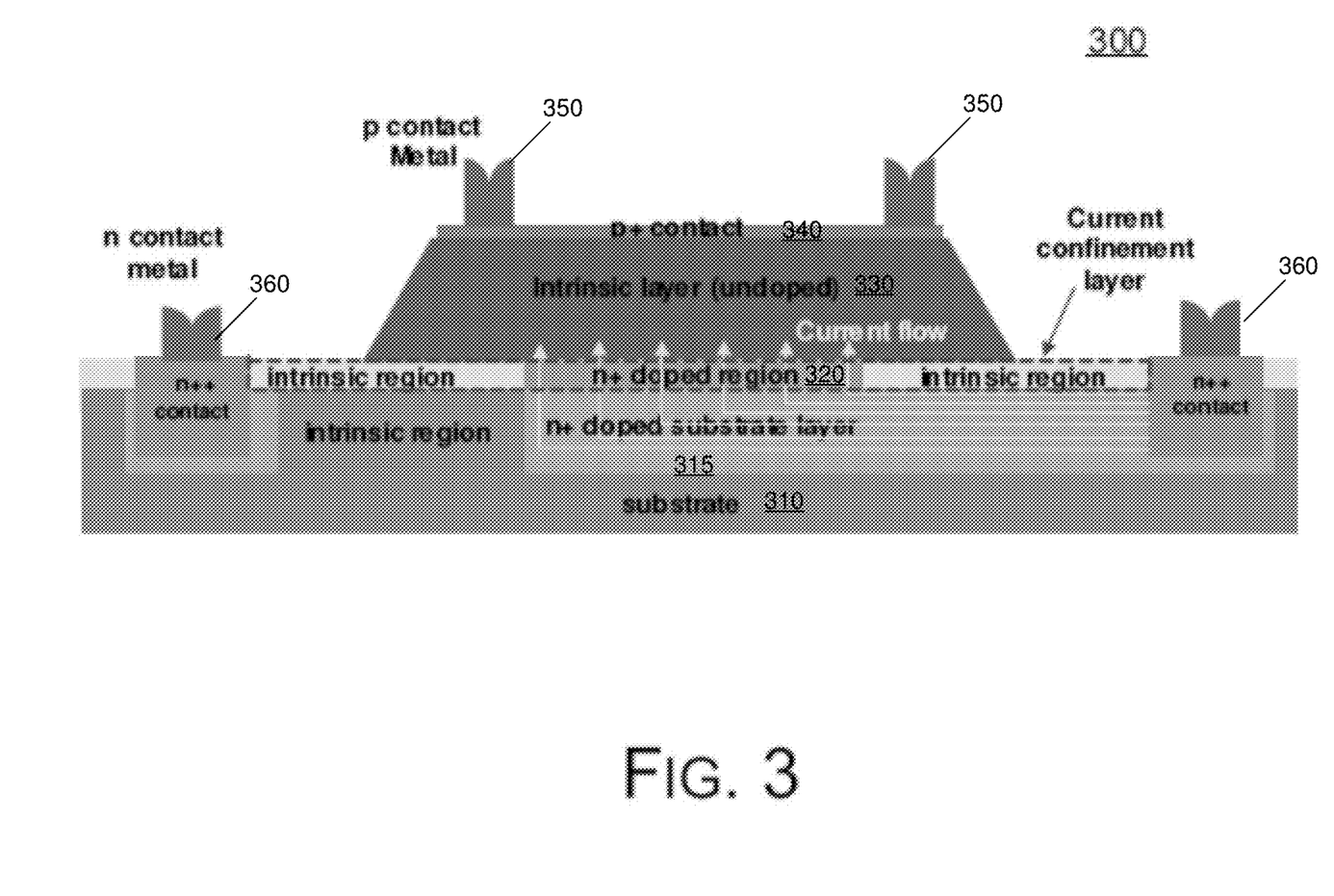
FIG. 3 is a structural diagram of a photodiode device with current confinement layer and patterned substrate in accordance with an embodiment of the present disclosure.

FIG. 3 illustrates a photodiode device 300 with current confinement layer and patterned substrate in accordance with an embodiment of the present disclosure.

As shown in FIG. 3, the photodiode device 300 includes a substrate 310, a current confinement layer 320 disposed on the substrate 310, an absorption layer 330, which may be an intrinsic layer, disposed on the current confinement layer 320, and an electrical contact layer 340 disposed on the absorption layer 330 for electrical connection. One or more electrical contacts 350 of the first polarity (e.g., p contacts), made of metal for example, may be disposed on the electrical contact layer 340, which is doped with dopants of the first polarity. The substrate 310 may be or made from, for example, a bulk Si wafer or a SOI wafer. The substrate 310 is heavily doped, and thus has a doped layer 315 doped with dopants of the second polarity opposite the first polarity (e.g., n+ doped substrate layer) near its top surface on which the current confinement layer 320 is disposed. One or more electrical contacts 360 of the second polarity (e.g., n++ contacts) may be located on the periphery of, and in contact with, the doped layer 315 and the current confinement layer 320.

One major difference between the photodiode device 300 and the photodiode device 100 is that the doping pattern of the doped layer 315 of the substrate 310 is different from the doping pattern of the doped layer 115 of the substrate 110. For example, as shown in FIG. 3, the doping layer 315 may be patterned such that the doping layer 315 has a non-uniform distribution of doping concentration in the area beneath the current confinement layer 320.

The current confinement layer 320 may be formed by, for example, growth of Si, GeSi, Ge or other III-V material on the substrate 310. After growth, the current confinement layer 320 is doped in a pattern. For example, a select portion in the current confinement layer 320 (e.g., the central region thereof as shown in FIG. 3) is doped with higher concentration than other portions of the current confinement layer 320 (e.g., regions of the current confinement layer 320 surrounding the central region thereof). That is, the central region of the current confinement layer 320 may be doped while the regions surrounding the central region of the current confinement layer 320 may be intrinsic regions.

The absorption layer 330 is configured to collect optical signal, and may be formed by, for example, growth of Si, GeSi, Ge or other III-V material on the current confinement layer 320.

Different from conventional designs such as that shown in FIG. 7, the photodiode device 300 includes the current confinement layer 320 for reducing dark current. The current confinement layer 320 is not uniformly doped and has some pattern. As a result, most of the conductive currents will be confined to a region inside the heavily doped region of the current confinement layer 320 because of resistance differences.

In one embodiment, the material growth may include epitaxial processes done by RPCVD, UHV/CVD or MOCVD.

In one embodiment, the heavily doped region of the current confinement layer 320 may have a doping concentration from about $1 \times 10^{16}$ to about $1 \times 10^{20}/cm^3$. Moreover, the intrinsic regions of the current confinement layer 320 may have a doping concentration with a doping concentration less than $1 \times 10^{16}/cm^3$.

In one embodiment, the photodiode device 300 may be either a normal incident photodiode or a waveguide photodiode.

As shown in FIG. 3, the dopant distribution of the doped layer 315 of the substrate 310 may be patterned. In one embodiment, the patterned and doped substrate 310 may be formed by implantation on an intrinsic substrate, such as a bulk Si wafer or a SOI wafer, for example.

In one embodiment, the heavily doped region of the doped layer 315 on the substrate 310 may have a doping concentration from $1 \times 10^{16}$ to about $1 \times 10^{20}/cm^3$. Moreover, the intrinsic regions of the substrate 310 may have a doping concentration with a doping concentration less than $1 \times 10^{16}/cm^3$.

Figure 4:
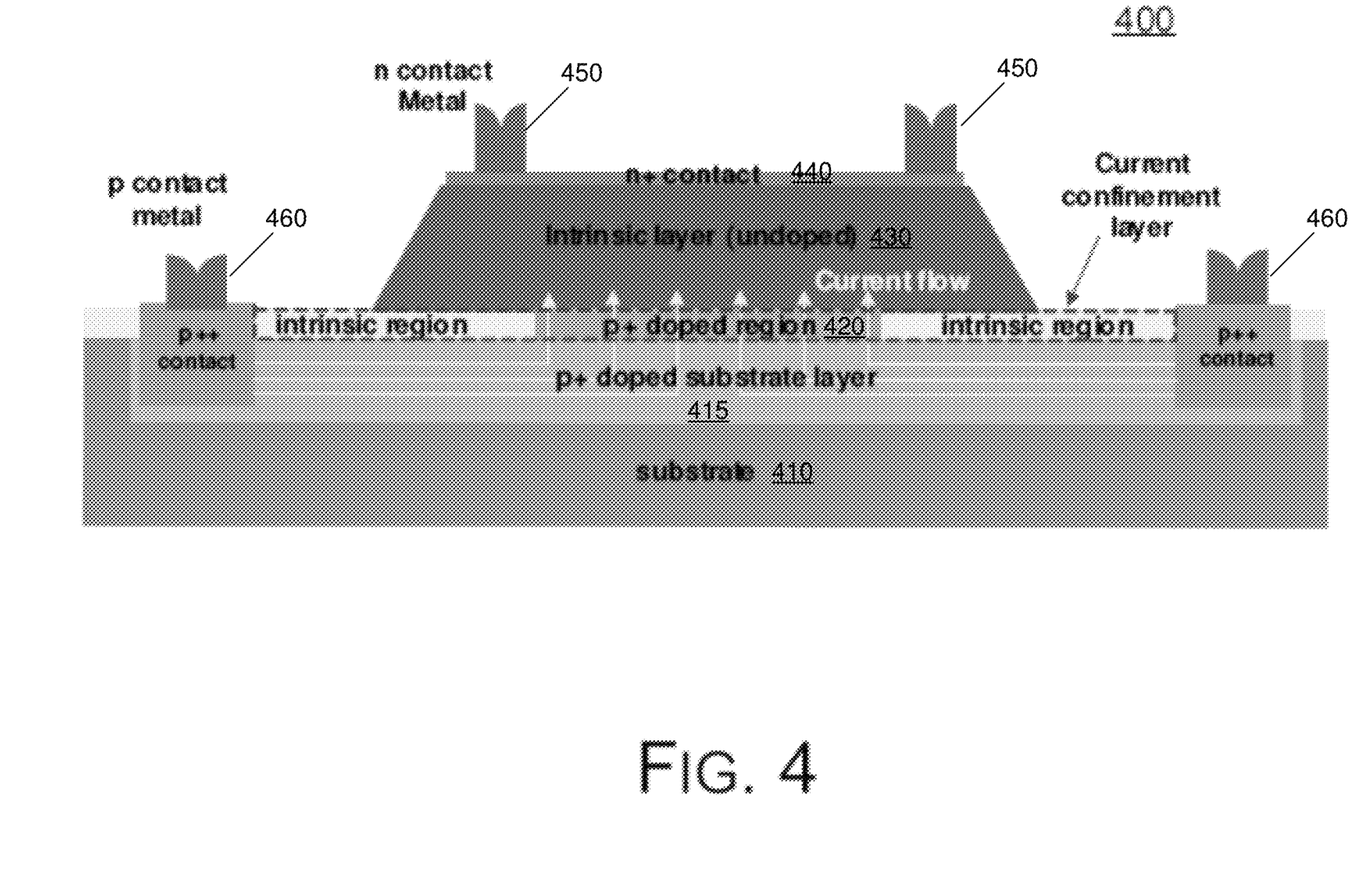
FIG. 4 is a structural diagram of a laser device with current confinement layer in accordance with an embodiment of the present disclosure.

FIG. 4 illustrates a laser device 400 with current confinement layer in accordance with an embodiment of the present disclosure.

Other than photodiodes, the novel structure of the present disclosure can be applied to laser for reducing threshold current, shown in FIG. 4. In one embodiment, the laser device 400 may be either an edge-emitting laser or a vertical cavity surface emitting laser (VCSEL).

As shown in FIG. 4, the laser device 400 includes a substrate 410, a current confinement layer 420 disposed on the substrate 410, an active layer 430, which may be an intrinsic or heavily doped layer (e.g., n+ doped), disposed on the current confinement layer 420, and an electrical contact layer 440 disposed on the active layer 430 for electrical connection. One or more electrical contacts 450 of the second polarity (e.g., n contacts), made of metal for example, may be disposed on the electrical contact layer 440, which is doped with dopants of the second polarity. The substrate 410 may be or made from, for example, a bulk Si wafer or a SOI wafer. The substrate 410 is heavily doped, and thus has a doped layer 415 doped with dopants of the first polarity opposite the second polarity (e.g., p+ doped substrate layer) near its top surface on which the current confinement layer 420 is disposed. One or more electrical contacts 460 of the first polarity (e.g., p++ contacts) may be located on the periphery of, and in contact with, the doped layer 415 and the current confinement layer 420.

The current confinement layer 420 may be formed by, for example, growth of Si, GeSi, Ge or other III-V material on the substrate 410. After growth, the current confinement layer 420 is doped in a pattern. For example, a select portion in the current confinement layer 420 (e.g., the central region thereof as shown in FIG. 4) is doped with higher concentration than other portions of the current confinement layer 420 (e.g., regions of the current confinement layer 420 surrounding the central region thereof). That is, the central region of the current confinement layer 420 may be doped while the regions surrounding the central region of the current confinement layer 420 may be intrinsic regions.

The active layer 430 is configured to generate light, and may be formed by, for example, growth of Si, GeSi, Ge or other III-V material on the current confinement layer 420.

Different from conventional designs such as that shown in FIG. 7, the laser device 400 includes the current confinement layer 420 for reducing threshold current. The current confinement layer 420 is not uniformly doped and has some pattern. As a result, most of the conductive currents will be confined to a region inside the heavily doped region of the current confinement layer 420 because of resistance differences.

In one embodiment, the material growth may include epitaxial processes done by RPCVD, UHV/CVD or MOCVD.

In one embodiment, the heavily doped region of the current confinement layer 420 may have a doping concentration from about 1×1016 to about 1×1020/cm3. Moreover, the intrinsic regions of the current confinement layer 420 may have a doping concentration with a doping concentration less than 1×1016/cm3.

In one embodiment, the laser device 400 may be either an edge-emitting laser or a vertical cavity surface emitting laser (VCSEL).

Figure 5:
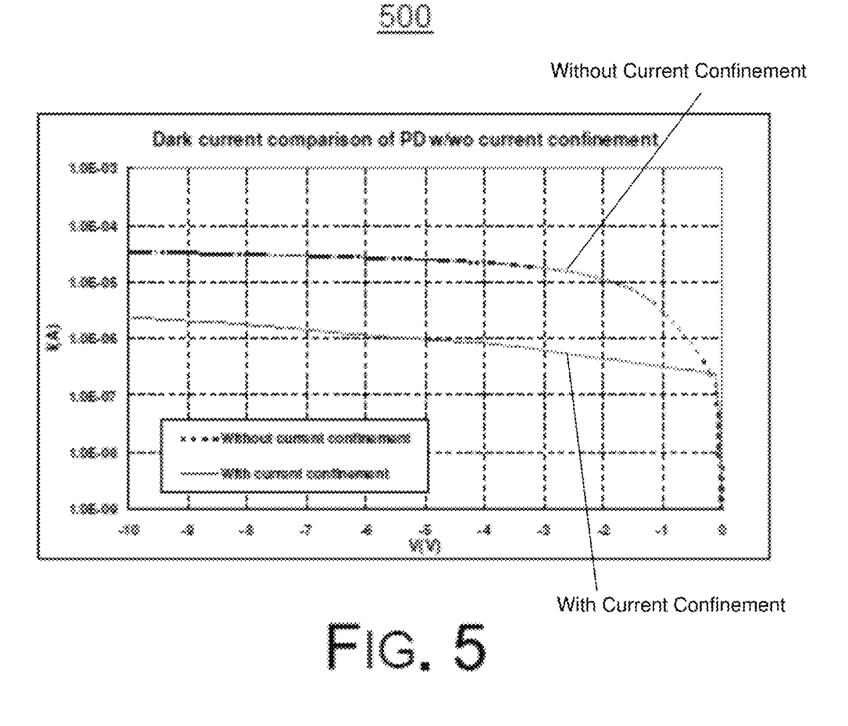
FIG. 5 is a chart showing photodiode dark current with and without the current confinement layer in accordance with another embodiment of the present disclosure.
Figure 6:
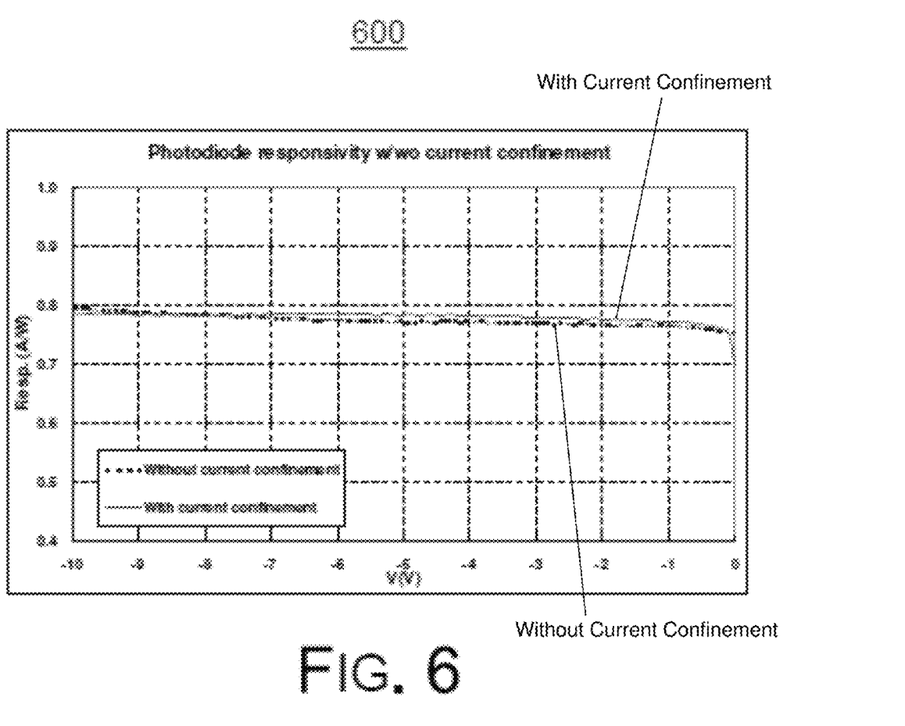
FIG. 6 is a chart showing photodiode responsivity with and without the current confinement layer in accordance with another embodiment of the present disclosure.

FIG. 5 is a chart 500 showing photodiode dark current with and without the current confinement layer in accordance with another embodiment of the present disclosure. FIG. 6 is a chart 600 showing photodiode responsivity with and without the current confinement layer in accordance with another embodiment of the present disclosure.

As shown in FIGS. 5 and 6, the novel structure of each of the photodiode device 100, the photodiode device 200, the photodiode device 300 and the laser device 400, which includes a current confinement layer, reduces dark current without negatively impacting (e.g., causing loss of) the responsivity of the device.

For high speed photodiode, capacitance is a limiting parameter especially for normal incident device. The photodiode capacitance is determined by material permittivity, junction area and depletion depth as expressed by the following formula:

$$C = \varepsilon_0 \varepsilon_r \frac{A}{d}$$

Here, $\varepsilon_0$ is the permittivity in vacuum, $\varepsilon_r$ is the material relative permittivity, A is the junction area, and d is the depletion depth. For germanium, the relative permittivity ($\varepsilon_r\_$Ge) is 16, which is larger than other commercial III-V materials ($\varepsilon_r\_$InP=12.9, $\varepsilon_r\_$GaAs=12.5). As a result, Ge made photodiode shows relatively worse performance when it has the same aperture as III-V material made photodiodes.

Figure 8:
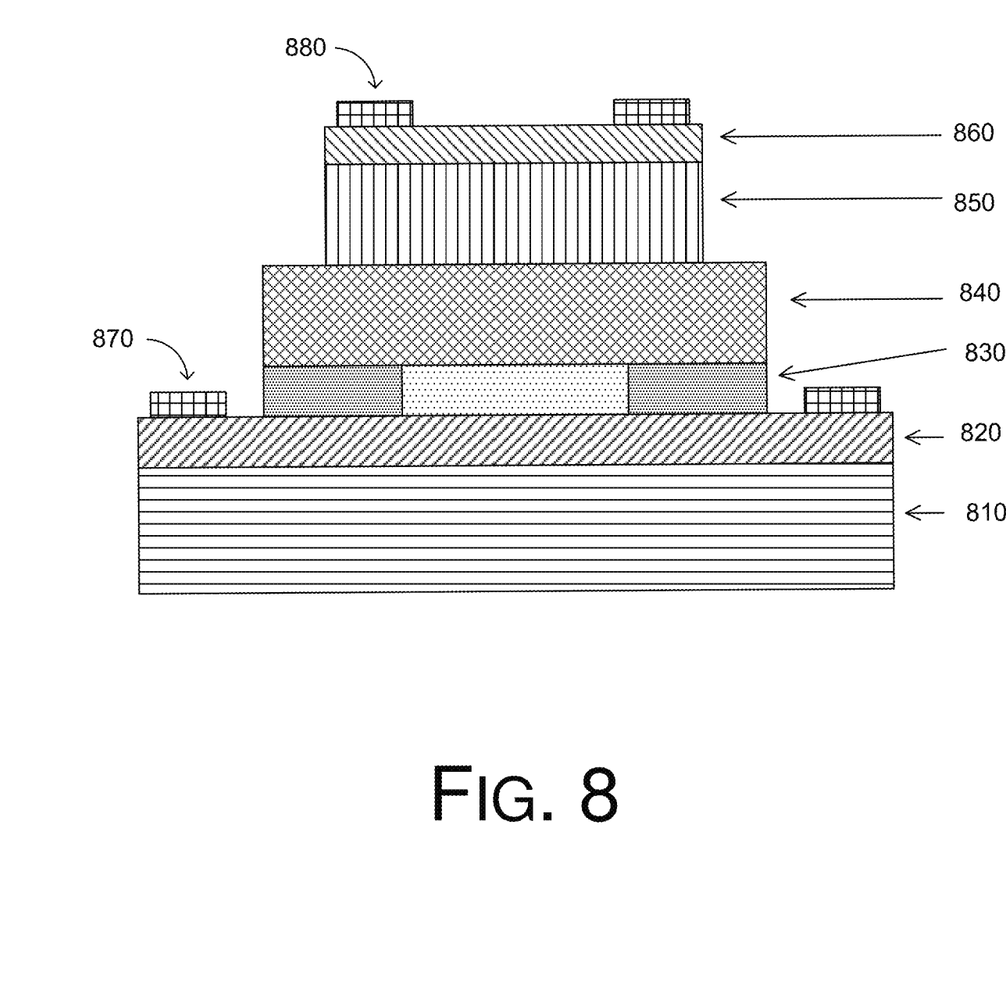
FIG. 8 is a structural diagram of a photodiode device with current confinement layer in accordance with an embodiment of the present disclosure.

FIG. 8 is a structural diagram of a photodiode device 800 with current confinement layer in accordance with an embodiment of the present disclosure. In order to improve high speed performance of Ge photodiode, photodiode device 800 is provided with some Si ($\varepsilon_r\_$Si=11.7) layer and is described below.

Referring to FIG. 8, photodiode device 800 may include: a substrate 810, which may be made of a bulk Si or silicon-on-insulator (SOI) wafer; a bottom contact layer 820, which may be a Si layer heavily doped with n dopants (n+) and disposed on the substrate 810; a current confinement layer 830, which may be made of Si and disposed on the bottom contact layer 820; an intrinsic layer 840, which may be made of Si and disposed on the current confinement layer 830; an absorption layer 850, which may be an intrinsic or p-doped layer composed by Ge, GeSi, GeSn, other III-V materials and disposed on the intrinsic layer 840; and a top contact layer 860, which may be disposed on the absorption layer 850. Photodiode device 800 may also include n contact metal 870 disposed on the bottom contact layer 820, and p contact metal 880 disposed on the top contact layer 860.

In some embodiments, the current confinement layer 830 may include a central region and an edge region surrounding the central region. The current confinement layer 830 may be doped with n dopants, where a concentration of the n dopants in the central region may be higher than a concentration of the n dopants in the edge region.

In some embodiments, the intrinsic layer 840 may have a thickness between 100 nm and 600 nm. The intrinsic layer 840 may be depleted during a photodiode operation of photodiode device 800.

Figure 9:
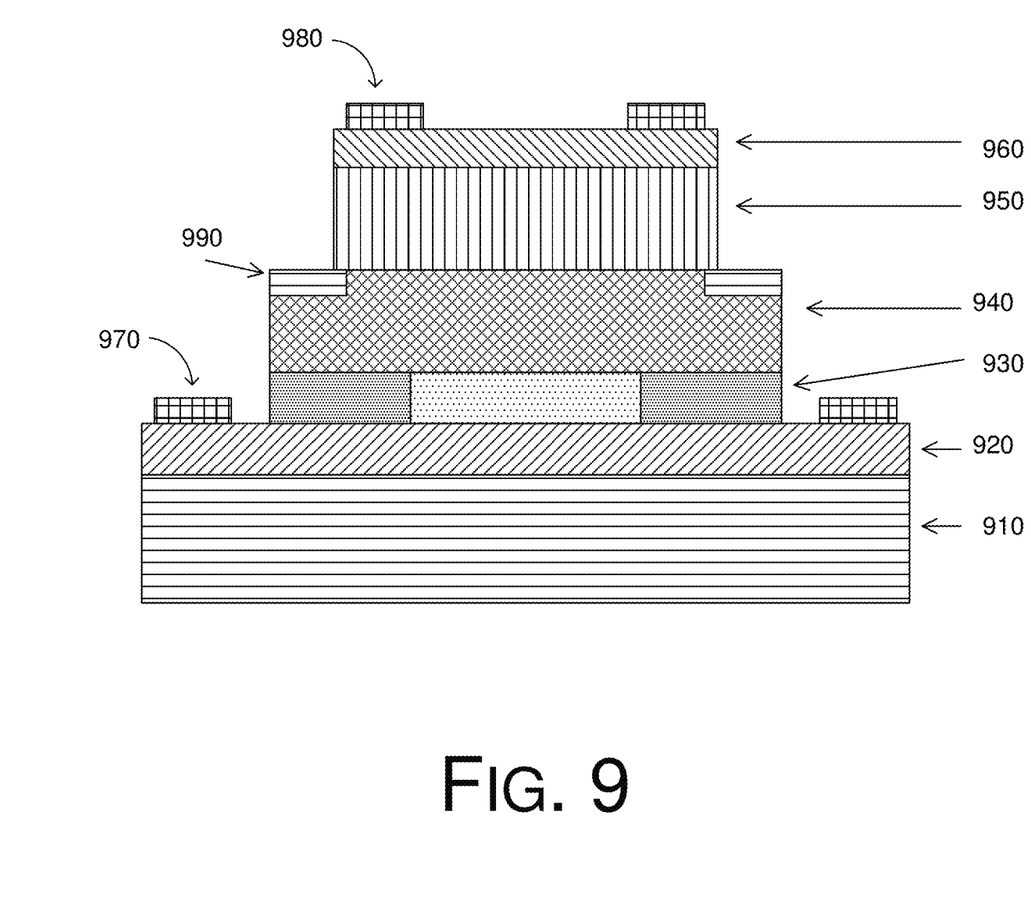
FIG. 9 is a structural diagram of a photodiode device with current confinement layer in accordance with another embodiment of the present disclosure.

FIG. 9 is a structural diagram of a photodiode device 900 with current confinement layer in accordance with another embodiment of the present disclosure. Photodiode device 900 may be a variation of photodiode device 800.

Referring to FIG. 9, photodiode device 900 may include: a substrate 910, which may be made of a bulk Si or SOI wafer; a bottom contact layer 920, which may be a Si layer heavily doped with n dopants (n+) and disposed on the substrate 910; a current confinement layer 930, which may be made of Si and disposed on the bottom contact layer 920; an intrinsic layer 940, which may be made of Si and disposed on the current confinement layer 930; an absorption layer 950, which may be an intrinsic or p-doped layer composed by Ge, GeSi, GeSn, other III-V materials and disposed on the intrinsic layer 940; and a top contact layer 960, which may be disposed on the absorption layer 950. Photodiode device 900 may also include n contact metal 970 disposed on the bottom contact layer 920, and p contact metal 980 disposed on the top contact layer 960.

In some embodiments, the current confinement layer 930 may include a central region and an edge region surrounding the central region. The current confinement layer 930 may be doped with n dopants, where a concentration of the n dopants in the central region may be higher than a concentration of the n dopants in the edge region.

In some embodiments, the intrinsic layer 940 may have a thickness between 100 nm and 600 nm. The intrinsic layer 940 may be depleted during a photodiode operation of photodiode device 900.

Different from photodiode device 800, photodiode device 900 further includes a guard ring 990 disposed in the intrinsic layer 940. The guard ring 990 may be on a side of the intrinsic layer 940 that faces the absorption layer 950. The guard ring 990 may be slightly doped with p dopants.

Figure 10:
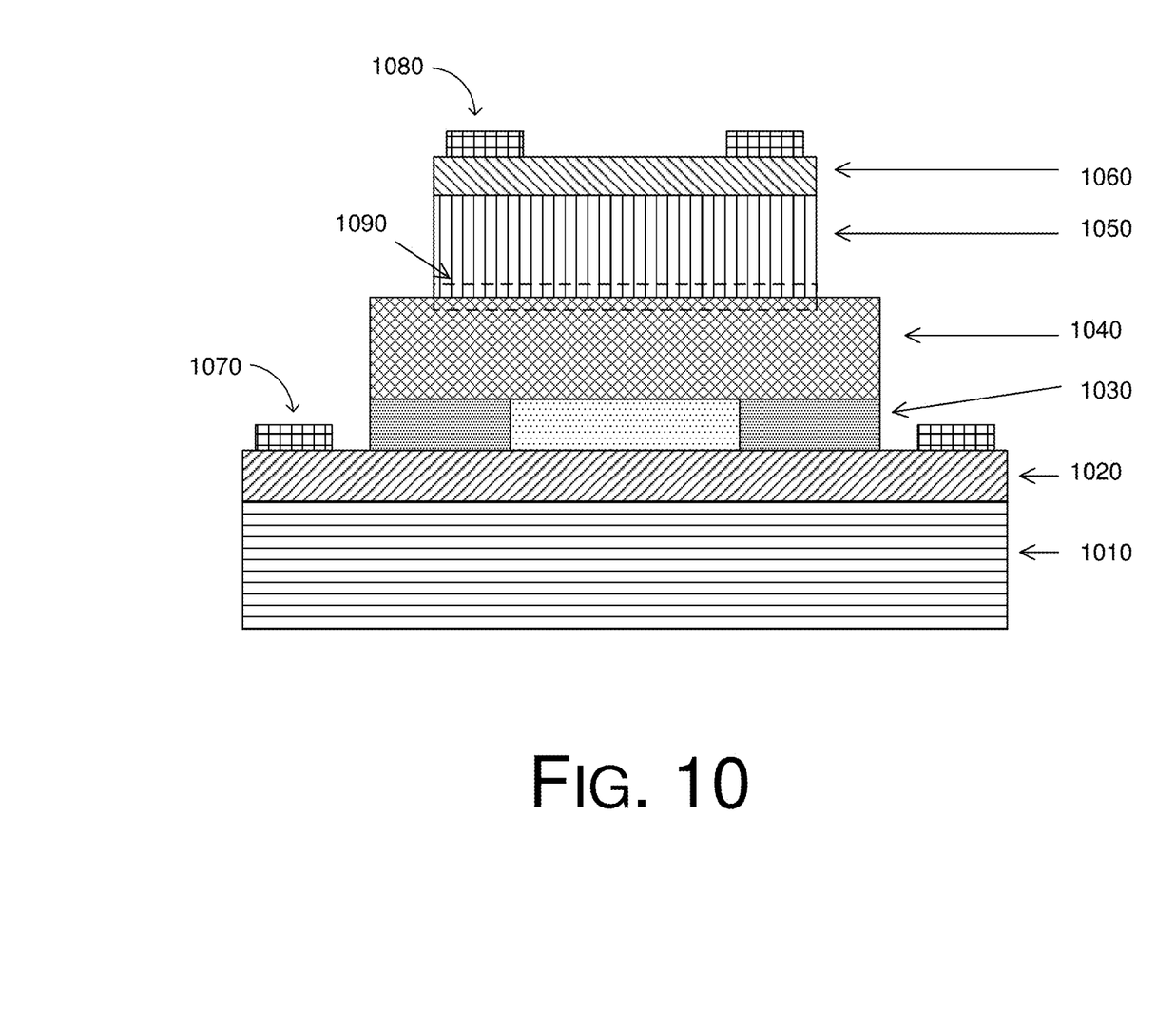
FIG. 10 is a structural diagram of a photodiode device with current confinement layer in accordance with yet another embodiment of the present disclosure.

FIG. 10 is a structural diagram of a photodiode device 1000 with current confinement layer in accordance with yet another embodiment of the present disclosure. Photodiode device 1000 may be a variation of photodiode device 800.

Referring to FIG. 10, photodiode device 1000 may include: a substrate 1010, which may be made of a bulk Si or SOI wafer; a bottom contact layer 1020, which may be a Si layer heavily doped with n dopants (n+) and disposed on the substrate 1010; a current confinement layer 1030, which may be made of Si and disposed on the bottom contact layer 1020; an intrinsic layer 1040, which may be made of Si and disposed on the current confinement layer 1030; an absorption layer 1050, which may be an intrinsic or p-doped layer composed by Ge, GeSi, GeSn, other III-V materials and disposed on the intrinsic layer 1040; and a top contact layer 1060, which may be disposed on the absorption layer 1050. Photodiode device 1000 may also include n contact metal 1070 disposed on the bottom contact layer 1020, and p contact metal 1080 disposed on the top contact layer 1060.

In some embodiments, the current confinement layer 1030 may include a central region and an edge region surrounding the central region. The current confinement layer 1030 may be doped with n dopants, where a concentration of the n dopants in the central region may be higher than a concentration of the n dopants in the edge region.

In some embodiments, the intrinsic layer 1040 may have a thickness between 100 nm and 600 nm. The intrinsic layer 1040 may be depleted during a photodiode operation of photodiode device 1000.

Different from photodiode device 800, photodiode device 1000 further includes a compensated doping region 1090 disposed between the intrinsic layer 1040 and the absorption layer 1050. The compensated doping region 1090 may be slightly doped with n dopants.

Additional Note

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A device, comprising:

a substrate;

a bottom contact layer of a first polarity and disposed on the substrate;

a current confinement layer disposed on the bottom contact layer;

an intrinsic layer disposed on the current confinement layer;

an active layer disposed on the intrinsic layer; and a top contact layer of a second polarity and disposed on the active layer, the second polarity opposite to the first polarity.

2. The device of claim 1, wherein the current confinement layer comprises a central region and an edge region surrounding the central region, wherein the current confinement layer is doped with first-type dopants of the first polarity, and wherein a concentration of the first-type dopants in the central region is higher than a concentration of the first-type dopants in the edge region.

3. The device of claim 1, wherein the substrate comprises a bulk silicon (Si) wafer a silicon-on-insulator (SOI) wafer.

4. The device of claim 1, wherein the bottom contact layer is made of Si and is heavily doped with first-type dopants of the first polarity.

5. The device of claim 1, wherein the current confinement layer is made of Si.

6. The device of claim 1, wherein the intrinsic layer comprises an intrinsic Si layer.

7. The device of claim 1, wherein the active layer comprises a germanium (Ge), GeSi, GeSn, or other III-V material active layer.

8. The device of claim 1, wherein the first polarity is p and the second polarity is n.

* * * * *